United States Patent [19]

Kobayashi et al.

[11] Patent Number: 5,595,604
[45] Date of Patent: Jan. 21, 1997

[54] WAFER SUPPORTING BOAT

[75] Inventors: Shuichi Kobayashi, Shirakawa; Masayuki Kobayashi, Fukushima-ken, both of Japan; Tsutomu Yuri, Livingston, United Kingdom; Youichi Serizawa, Nishigo-mura, Japan; Mamoru Akimoto, Urawa, Japan; Shinichi Okoshi, Yamagata, Japan

[73] Assignee: Shin-Etsu Handotai Co., Ltd., Japan

[21] Appl. No.: 528,560

[22] Filed: Sep. 15, 1995

[30] Foreign Application Priority Data

Sep. 30, 1994 [JP] Japan ................. 6-259802

[51] Int. Cl.$^6$ .................................. C23C 16/00
[52] U.S. Cl. ...................... 118/715; 118/728; 118/729
[58] Field of Search ............................ 118/715, 720, 118/728, 729, 730

[56] References Cited

U.S. PATENT DOCUMENTS 3,226,254  12/1965  Reuschel ........................ 118/715

FOREIGN PATENT DOCUMENTS

| 0164928 | 12/1985 | European Pat. Off. |  |
|---|---|---|---|
| 0600516 | 6/1994 | European Pat. Off. |  |
| 3807710 | 9/1989 | Germany. |  |
| 0257129 | 12/1985 | Japan | 118/730 |
| 0027625 | 2/1986 | Japan | 118/730 |
| 0047134 | 2/1987 | Japan | 118/715 |

*Primary Examiner*—R. Bruce Breneman
*Assistant Examiner*—Felisa Garrett
*Attorney, Agent, or Firm*—Whitham, Curtis, Whitham & McGinn

[57] ABSTRACT

A vertical wafer supporting boat is provided in which adequate reaction gas is supplied to the portion of a wafer surface to be treated which is inserted in holding grooves in members of the wafer supporting boat during the heat treatment and thus uniform heat treatment is achieved across the surface of each wafer. The particular groove shape preferably exploits the rotation of the boat in a vertical furnace to thereby uniformly supply the reaction gas on the entire surface to be treated of each of the wafers disposed in the boat. The holding grooves are inclined relative to a direction tangent to a wafer edge in order that the clearance facing the surface to be treated of a wafer is profiled to have an edge-like space by gradually increasing the width in the tangential direction of the wafer and, preferably, the internal groove surface opposed to the surface to be treated of the wafer is inclined to increase in width toward the center of the wafer.

27 Claims, 3 Drawing Sheets

2': GAS STREAM RECTIFYING TUBE

REACTION GAS

EXHAUST

WAFER SUPPORTING BOAT

BACKGROUND OF THE INVENTION

1. Field of the Invention

The present invention relates to a wafer supporting boat used in a vertical-type heat treatment apparatus, more particularly, the present invention relates to a wafer supporting boat used in a vertical-type heat apparatus such as a CVD reactor and a diffusion furnace, which conducts a predetermined heat treatment with rotation thereof in the furnace tube (hereinafter referred to as vertical wafer supporting boat).

2. Related Prior Art

A wafer supporting boat—used in a heat treatment furnace for semiconductor wafers—has had in general a structure that shaft-like or long rectangular members extend parallel to the axis of the furnace tube and which are fixedly spaced by a frame. A plurality of grooves for holding the wafers, are carved or notched at a constant interval on the internal side of each member extending in the axial direction of the furnace tube. The frame (which may be integrally formed with the members) positions the members, extending in the axial direction of the furnace tube, in the crosssectional shape of an arc, which curves following the profile of the sectional internal wall surface of the furnace tube, and a plurality of semiconductor wafers are respectively held in the regularly spaced grooves for holding wafer (hereinafter referred to as wafer holding grooves or simply holding grooves) and regularly disposed in the treatment space of the furnace by a single supporting member or a plurality of supporting members of each wafer holding boat.

As to heat treatment apparatuses in which such a wafer supporting boat is installed, two types of apparatus are generally available. Specifically, a horizontal-type heat treatment apparatus, where the axial line of the furnace tube extends in a horizontal direction and a vertical-type heat treatment apparatus, where the axial line of the furnace extends in a vertical direction are both available. Recently, the vertical-type heat treatment apparatus has been used more generally due to reduction of the required installment floor space and facilitation of operational automation thereof.

A vertical wafer supporting boat has basically horizontal rectangular slit grooves, which are designed to hold wafers in horizontal, or oblique, rectangular slit grooves, which are so designed that the wafers are posed obliquely with each free end upwardly positioned, instead of adopting such groove shapes as V grooves or Y grooves as in the case of a horizontal-type heat treatment apparatus. With such slit grooves as mentioned above, in which wafers have been inserted, upper and lower clearances between a wafer and the inner walls or sides of the holding grooves are small and shortage of reactant material or turbulence of a reaction gas therefore occurs locally in the holding grooves. Such shortage or turbulence causes poor heat treatment or poor external appearance in the portions of the wafers inside the holding grooves and in the neighborhood of a supporting member or members, in which the holding grooves are carved.

In order to prevent these faults, it is considered advantageous to broaden the width of each of the grooves. With broadened grooves, the wafers are, however, subject to wafer chipping and the like due to vibration during heat treatment or other processes.

For the purpose of solving the aforementioned faults and facilitating guidance of wafers, a technology has been disclosed that, as shown in FIG. 4, almost trapezoidal, profile holding grooves 101 are formed, being vertically arrayed, in a side surface of supporting poles 43, 44 to hold the wafers 10 in a linear contact. Although the aforementioned wafer supporting boat usually rotates during heat treatment, the boat can not avoid the faults to any great degree and only provides a small improvement at each end of the openings of the grooves 101 with a reaction gas penetrating from a side, even though each holding groove has a sectional shape which increases in width toward the center of a treatment space.

On the other hand, in such a structure that the edge of each of the wafers contact in a linear fashion with a holding groove, a contact mark between the wafer and the boat (hereinafter referred to as boat contact mark or simply boat mark) or chipping at the edge occurs due to the difference between the thermal expansion coefficients between the wafer and boat and the like. The boat contact mark not only affects adversely the quality of the treated wafer, but also the chips can to be held fast in the form of protrusions in a holding groove or cause particle generation.

SUMMARY OF THE INVENTION

The present invention has an object, in view of the faults of the prior art, to provide a vertical wafer supporting boat, with which enough of a reaction gas is supplied on the surfaces of each of wafers within the holding grooves to enable uniform heat treatment of the wafers and across the surfaces of each wafer including wafer surface portions contained in the grooves and, at the same time, occurrence of poor external appearance of the wafers is also fully suppressed.

To achieve the above and other objects of the invention, the present invention provides a vertical wafer supporting boat, with which the contacting edge portion or portions of each of wafers with a holding groove is changed from a linear contact of the prior art to a point contact so as to suppress a boat contact mark or marks on a wafer occurring between a wafer and the boat due to the difference between the thermal expansion coefficients and the like, and, at the same time, the generation of a protrusion or protrusions in a holding groove and particle generation are prevented.

In accordance with another aspect of the invention, the present invention provides a vertical wafer supporting boat, which is preferably used in a CVD reactor or other apparatuses for heat treatment in which the wafer supporting boat is rotated during operation.

The present invention is applied to a vertical wafer supporting boat, with which a predetermined heat treatment is conducted on the surfaces of wafers, which are disposed in a stacking manner by the help of the holding grooves, while the boat itself is preferably rotating inside of a furnace tube. More particularly, the rotation of the vertical wafer supporting boat may be exploited in order that a reaction gas is uniformly supplied to the surfaces of the wafers contained in the respective grooves.

The present invention has a first technical feature as a means for embodying such idea as mentioned above that each holding groove is inclined relative to the direction of the boat rotation and the upper and lower clearances in the holding groove facing the surface to be treated of a wafer increase in width in the direction of the boat rotation.

A second technical feature of the present invention is to enable a point contact between a wafer and the holding groove to actually happen with ease. This feature is realized by inclining downwardly the internal surfaces of the groove, respectively facing the surfaces to be treated of the wafer, relative both to the rotational direction of the boat and toward the center of the wafer.

The holding grooves need to support wafers with good stability. For this purpose, in the present invention, the internal width profile of a holding groove and the angle A of inclination thereof relative to the rotational direction of a boat are so designed that the upper surface of a wafer does not contact with the lower end edge of the upper internal surface of the holding groove, when an edge of the wafer is positioned at the upper end corner of the lower internal surface of the groove. More particularly, it is preferred that the angle A of inclination relative to the rotational direction of a boat is set in the range of 4° to 15°, preferably 5° to 12°, more preferably 6° to 10° and, on the other hand, the angle B of inclination toward the center of a wafer is set in the range of 8° to 20°, preferably 12° to 18°.

In heat treatment using an embodiment of a wafer holding boat according to the present invention having grooves set at the angles recited above, in which a uniform film can be formed all over both surfaces of a wafer, the aforementioned problems may occur to some degree, since the lower clearance, formed between a wafer and the lower internal surface of the groove, is subject to become narrower in comparison with the upper clearance above the wafer, when the lower surface of the wafer, on which particles are relatively less likely to attach, is intended to be the working surface in a further process. The present invention can effectively cope with such a case with the perfecting feature of the invention which will now be described.

When the treated surfaces are formed on both side surfaces of a wafer and especially the lower surface of the wafer is chosen as the working surface, effects similar to those of the first and second technical features also can be attained with regard to a vertical wafer supporting boat, by arranging the holding groove to be downwardly inclined relative to the rotational direction of the boat and the lower clearance formed between the lower internal surface of the groove and the wafer is thus profiled as to gradually increase in width along the rotational direction of the boat to form a edge-shaped space, and at the same time, the lower internal surface of the groove is downwardly inclined toward the center of the wafer.

The present invention is preferably applicable to the wafer supporting boats, which are used when the lower surfaces of wafers as large as 5 inches, 6 inches, 8 inches or more in diameter are treated in a CVD treatment. In this case, it is preferable that the width of the opening of each groove is set in the range of 3±1 mm, the angle A of inclination relative to the rotational direction of a boat is set in a range of 6°±3° and the angle B of inclination toward the center of a wafer is set in the range of 16°±2°.

The present invention is effectively applicable to a vertical wafer holding boat, not only rotating in the inside of a furnace tube but also being stationary in the inside of a furnace. In such cases of a vertical wafer supporting boat, each of the grooves is downwardly inclined relative to a tangential direction of the periphery of the boat, in other words to a tangential direction of the periphery of the wafer, and the upper or lower clearance, whichever the surface to be treated of each of the wafers faces, gradually increases in width in the direction of one of the tangential directions so that the clearance becomes an edge-shaped space.

The function of the present invention is explained below on the basis of, for example, a vertical-type CVD apparatus.

Wafers 10, which are made of silicon single crystal, are so disposed in a stacking manner in a vertical wafer supporting boat that the lower surfaces of the wafers are intentionally treated to be the working surfaces in a following process, since, though film formation is uniform on both surfaces of a wafer, the lower surfaces have a smaller chance of having particles attached thereto. Silane, as a reaction gas, is fed into the apparatus to form a polycrystal film on both surface sides of each of the wafers 10.

With the vertical wafer supporting boat, the holding grooves of which are formed so that the holding grooves 101 are a trapezoid in sectional shape, for example, as in the prior art as shown in FIG. 4. However, in FIG. 4, the lower clearance 20A between a wafer 10 and the inclined lower internal surface 21a, is much narrower compared with the upper clearance 20B above the wafer 10 and thus the reaction gas is not adequately supplied to the lower clearance 20A and thereby a polysilicon film is not formed uniform in thickness but is thinner locally at the lower surface contained in the groove. This local poor uniformity of thickness is also called a boat mark, which is one of the poor external appearances of a wrongly treated wafer.

On the other hand, according to the present invention, as shown in FIG. 1(b), the clearances 20A, 20B of a holding groove, which face the surfaces to be treated of a wafer 10, increase in width in the rotational direction R of a boat 4 so that they are each an edge-like space and as a result, a reaction gas can easily penetrate into the groove of the boat 4, in which the wafer is inserted, and the boat mark mentioned above is reduced or suppressed.

In the aforementioned structure, where, as shown in FIG. 1(a), a wafer 10 is so placed that a peripheral edge of the wafer is positioned at the upper end corner 22 of the lower inclined surface 21a of a holding groove 21, if, holding poles 43 and 44, in and along which holding grooves 21 are formed, have a drum-like shape in cross-section with the two opposed parallel surfaces, and the inclined lower internal surface 21a is inclined only in the single rotational direction R, there is a risk that a linear contact between the wafer and the groove will occur.

To solve the above problem, according to the present invention, the inclined lower internal surface 21a is inclined not only downwardly in the rotational direction R of a boat but also toward the center of a wafer 10 and thus the lower internal surface is inclined relative to the two directions, so that a point contact can be realized at the upper end corner of the lower internal surface 21a. Accordingly, the wafers received a heat treatment with such a vertical wafer supporting boat according to the present invention are improved in quality due to great decrease in occurrence of boat contact marks or chipping at the periphery of the wafers 10, since great decrease in the contacting area of the wafers 10 with the holding grooves is realized through a change from linear contact to point contact.

The lower clearance gradually increases the widths not only in the rotational direction but also toward the center of the wafer forming an edge-shaped space. Therefore, the penetration of a reaction gas from the rotational direction into the lower clearance is also facilitated, so that occurrence of the boat mark is effectively suppressed.

If the angle A of inclination relative to the rotational direction R of the boat is designed to be too large, which means that a slope line on the lower internal surface 21a approaches a vertical line, the stacking interval or pitch of the stacked wafers is undesirably forced to broaden and at the same time the upper surface of the wafer 10 has an undesirable chance to contact the lower end edge of the upper internal surface of the holding groove 21 above mentioned, when an edge of the wafer is positioned at the upper end corner 22 of the inclined lower internal surface 21a of the holding groove 21. If the angle A of inclination is too small, however, the penetration of the gas is not desirably carried out. In the present invention, the angle A of inclination is set in the range of 4° to 15°, preferably 5° to 12°, more preferably 6° to 10°.

The angle B of inclination toward the center of the wafer 10 is similar to the angle A of inclination. If the angle B of inclination is too large, which means that a slope on the lower internal surface 21a approaches a vertical line, the interval or pitch of the stacked wafers is undesirably forced to broaden and at the same time the stability of the wafer may be reduced, when an edge of the wafer is positioned at the upper end corner 22 of the lower internal surface 21a of the holding groove 21. On the other hand, if the angle of inclination B is too small, the penetration of the reaction gas is not desirably carried out. In the present invention, the angle of inclination B is set in the range of 8° to 20°, preferably 12° to 18°.

In the case that a vertical wafer supporting boat 4 is used to conduct CVD treatment on both surfaces of wafers each having a large diameter of 5 inches or more, it is preferable that the width of the opening of each of the holding grooves is set to be 3±1 mm, the angle A of inclination, which is the angle relative to the rotational direction R of the boat, is set at 6±3° and the angle B of inclination, which is that of the inclined lower internal surface of each holding groove 21 toward the center of the wafer, is set at 16±2°.

The present invention is particularly effective in the case that wafers are disposed in a vertically stacking manner, while the surface of each individual wafer is oriented horizontally. In this case, the back poles and side poles of the boat as shown in FIG. 2(b) can both have holding grooves of the same shape, and as to the material, highly pure materials comprising quartz, heat resistant glass, ceramics such as SiC or polycrystal silicon and the like can be used.

A vertical wafer supporting boat is also applicable to heat treatment of wafers in a stationary state with a function similar to the case of rotating the boat.

BRIEF DESCRIPTION OF THE DRAWINGS

These and other objects and many of the attendant advantages of the present invention will be readily appreciated as the same becomes better understood by reference to the following detailed description when considered in connection with the accompanying drawing.

DETAILED DESCRIPTION OF THE INVENTION

An embodiment of the present invention will be described in detail with reference to the accompanying drawings below. It should be understood that the sizes, materials, shapes, relative configuration and the like of the structural parts recited in the embodiment are not intended to limit the scope of the present invention but, rather, are intended as exemplary, unless otherwise specified.

Figure 3:
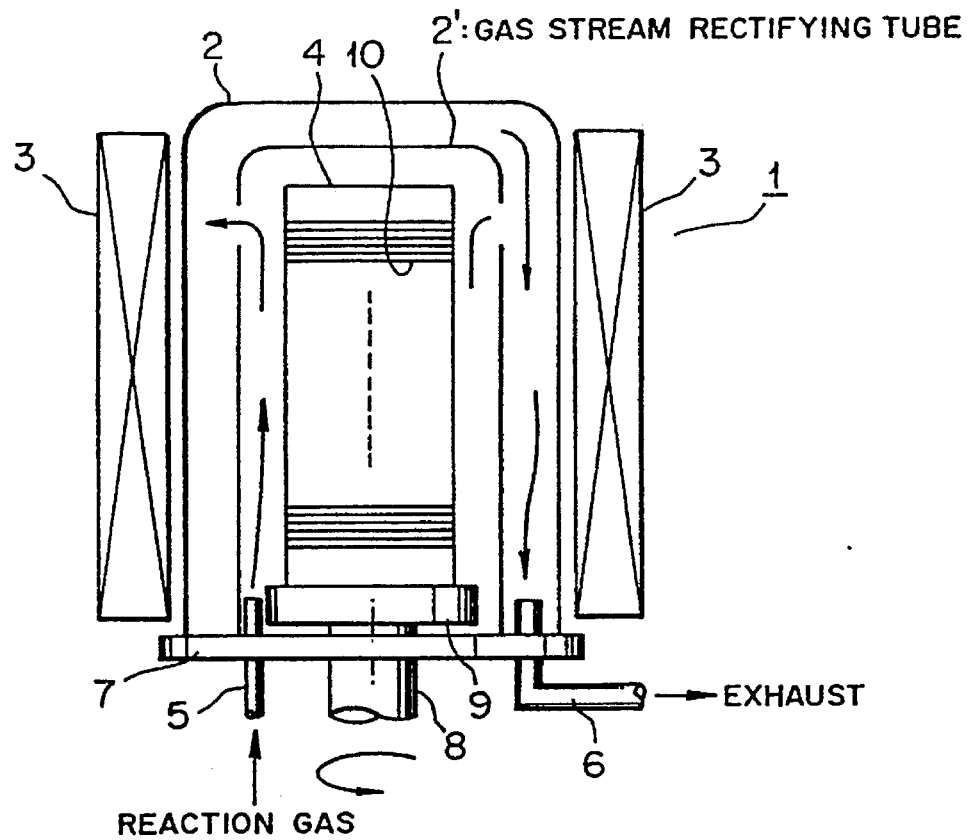
FIG. 3 is a schematic entire view of a vertical-type CVD apparatus equipped with the vertical wafer supporting boat of FIG. 2.

FIG. 3 shows a vertical-type CVD apparatus 1, to which the present invention is applied. The numeral 2 indicates a cylindrical quartz glass tube, which is a furnace tube, installed concentrically inside a heater 3 surrounding the tube. A gas inlet tube 5, which leads the reaction gas into the furnace, and a gas outlet tube 6 are both mounted in a penetrating manner to a sealing plate 7 for the open lower end of the furnace tube 2. The reaction gas fed through the gas inlet tube 5 is led upwardly inside a gas stream rectifying tube 2' along the stack of wafers 10 to be treated. After leaving the openings arranged at the upper portion of the gas stream rectifying tube 2', the reaction gas is then led downwardly, along the outer circumference thereof, and finally exhausted through the gas outlet tube 6.

Figure 2A:
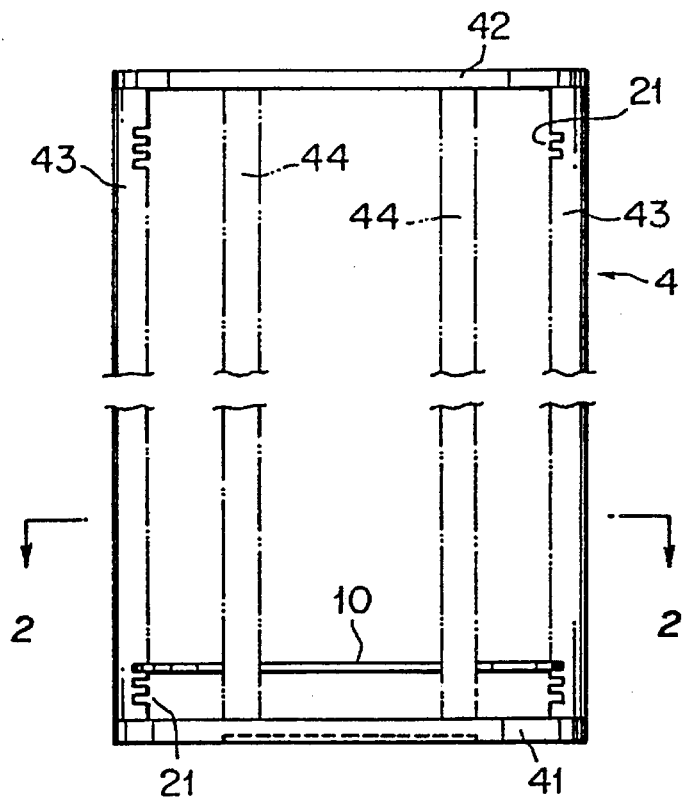
FIG. 2(a) is the entire front view of a vertical wafer supporting boat in which the holding grooves of FIG. 1(a) and FIG. 1(d) are formed.

Inside the furnace tube 2, a supporting plate 9 is horizontally mounted on a supporting shaft 8, which is vertically shiftable and rotatable by a drive mechanism not shown, and a vertical wafer supporting boat 4 made of quartz is installed on the supporting plate 9. The boat 4 comprises a bottom plate 41 and a top plate 42, which are disposed one above the other as shown in FIGS. 2(a) and (b). A pair of side poles 43 and a pair of back poles 44 are vertically arranged between the plates 41 and 42.

Figure 1D:
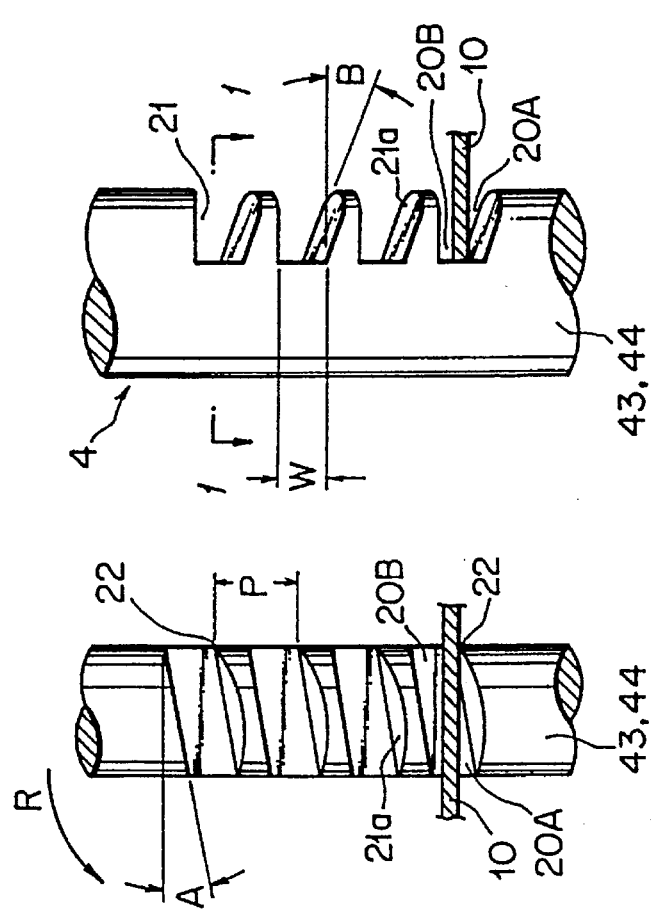
FIG. 1(d) is the sectional view taken on line 1—1 of FIG. 1(b)
Figure 2B:
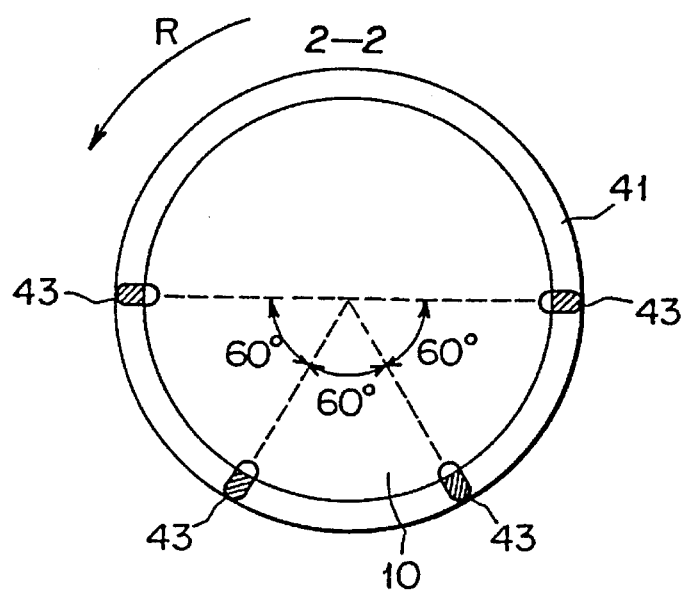
FIG. 2(b) is the sectional view taken on line 2—2 of FIG. 2(a)

A large number of wafer holding grooves 21, each of which will hereinafter be detailed, are formed in and along the side of each of the poles 43, 44, which faces the center of the bottom plate 41. The wafers 10 are held horizontally on the boat 4, in a stacking manner and at a constant pitch. The side poles 43 and the back poles 44 (hereinafter referred to as supporting poles) each have, as shown in FIG. 1(d), a drum-like shape in section, as if each of the supporting poles is formed from a round rod by forming two opposed vertical side planes, parallel with each other, along the sides thereof. The long dimension M of the cross-section of each of the supporting poles is so set as to point to the center of the bottom plate 41 as shown in FIG. 2(b).

The following advantages are achieved by so forming the cross-section of each of the supporting poles 43, 44 as to have the narrow width like a drum that wafers 10 can be held in a stable manner due to the large depth of a holding groove 21. The contained area of a wafer 10 in a holding groove 21 is diminished by narrowing the width as much as possible. The upper surface of each of the wafers 10 does not contact with the lower end edge of the inclined upper internal surface 21a of the holding groove 21 when an edge of each wafer is positioned at the upper end corner of the inclined lower internal surface 21a of the holding groove 21, even in the case that the angle A of inclination relative to the rotational direction R of a boat 4 is set at about 8°.

The angular positions of the poles around the center is designed in order that the wafers do not slip off the holding grooves 21 when the wafers are placed horizontally in the boat. For example, the angular intervals are set at a constant 60° as shown in FIG. 2(b). In a CVD apparatus 1 as mentioned above, the boat is installed in a manner such that the supporting shaft 8 is shifted downwardly to position the supporting plate 9 at the lower portion of the furnace tube 2; the boat 4, in which the wafers 10 have already been placed, is installed on the supporting plate 9; and the furnace tube 2 is hermetically sealed with a capping plate 7 and the boat 4 is adjusted in a predetermined position in the furnace tube 2, while the supporting shaft 8 is shifted upwardly. In this state, a predetermined gas phase growth is carried out in the following manner that the space in the furnace tube 2 is filled with an inert gas for replacing the original inner atmosphere; the space is then adjusted to be under vacuum; the space is heated at a predetermined temperature of 600° C. to 1200° C. by a heater 3; and a reaction gas is fed through an inlet gas tube 5, while the boat is rotated by the supporting shaft 8.

Now, the shape of the holding grooves 21 formed in the supporting poles 43, 44 will be described referring to FIG. 1(a) to FIG. 1(d). Preferably and for positioning wafers horizontally, as illustrated in FIG. 2(a), the holding grooves 21 in the supporting poles 43, 44 all have the same form.

Figure 1A:
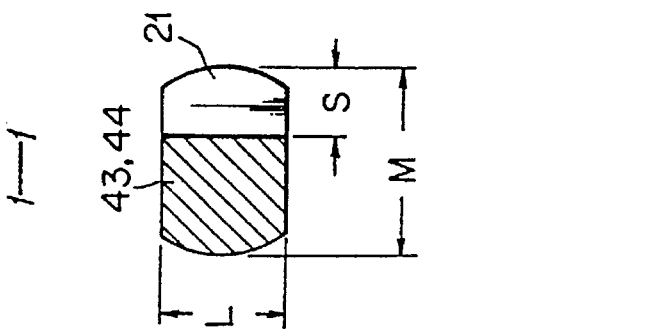
FIG. 1(a) is the front view of the holding grooves, which shows the shapes thereof, of an embodiment of the vertical wafer supporting boat according to the present invention.

FIG. 1(a) is the front view of the holding grooves 21.

Figure 1B:
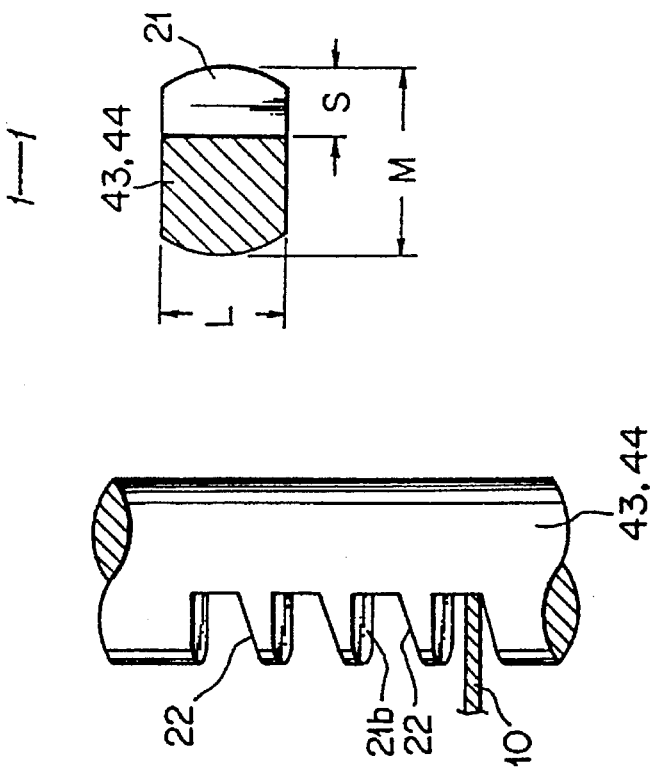
FIG. 1(b) is the left side view of the holding grooves, which shows the contours thereof as seen from the side where a reaction gas is led during the rotation of the boat.

FIG. 1(b) is the left side view and shows the contour of a groove as seen from the side, to which a reaction gas is led during rotation of the boat.

Figure 1C:
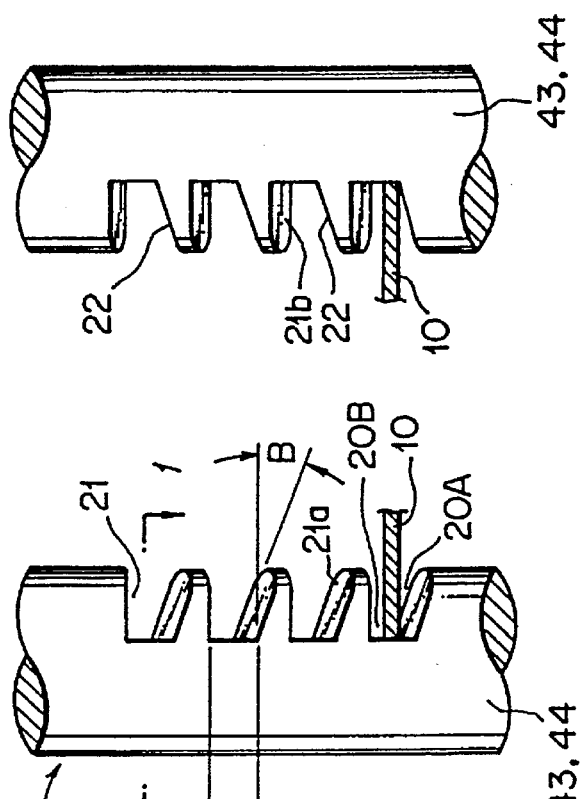
FIG. 1(c) is the right side view of the holding grooves, which shows the contours thereof as seen from the side of the following edge relative to the rotation of the boat.

FIG. 1(c) is the right side view and shows the contour of a groove at the following end during rotation of the boat.

FIG. 1(d) is the sectional view taken on line 1—1 of FIG. 1(b).

In the case of a boat 4 in which wafers 10 having a diameter of 8 inches and a thickness of 0.8 mm are stacked, the dimensions of the supporting poles are set in the following way in which the width L is in the range of 10 mm to 12 mm, the length M is in the range of 16 mm to 18 mm, the pitch P is in the range of 6.35 mm to 6.40 mm, the depth S is in the range of 5.0 mm to 6.0 mm, and the holding grooves each are inclined downwardly relative to the rotational direction R of the boat and the angle A of inclination is set at 6°±3°. As a result, the lower clearance 20A formed between the inclined lower internal surface 21a of a holding groove 21 and the wafer 10 can be roughly an edge-like space that the clearance 20A increases in width in the rotational direction R of the boat.

The lower internal surface 21a of the holding groove 21 is further inclined downwardly toward the center of a wafer and the B angle of inclination is set in the range of 16°±2°. As a result, the lower clearance 20A is formed to have an edge-like space with such a profile that the clearance gradually increases in width toward the center of the boat 4. The width W of the opening of each of the holding grooves 21 is set in the range of 3±1 mm. The pitch between wafers is restricted in distance if the width W is set too large and, on the other hand, if the width is set too small, the upper surface of a wafer 10 may contact the lower end edge 23 of the inclined upper internal surface of the holding groove 21 when an edge of the wafer 10 is placed at the upper end corner 22 of the inclined upper internal surface 21b of the holding groove 21.

Figure 4:
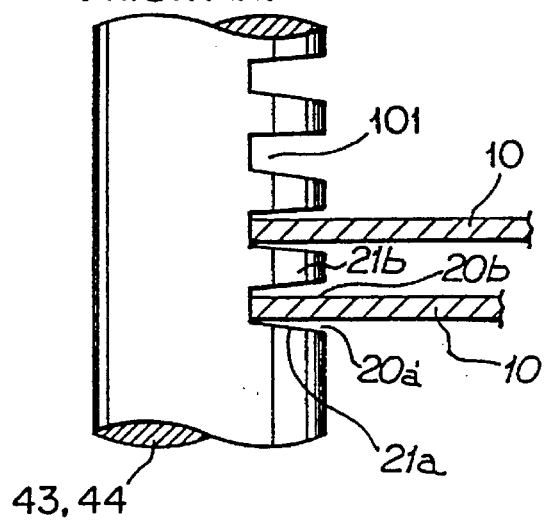
FIG. 4 is a view showing the shapes of the holding grooves of a vertical wafer supporting boat of the prior art.

In order to demonstrate the effectiveness of the invention, the boats having the holding grooves 21 as described above and the boats having holding grooves 101 shown in FIG. 4 are prepared 10 units each. Each set of the boats were installed with wafers of 8 inches in diameter loaded and CVD films were deposited on the wafers in an apparatus shown in FIG. 3. With the boat of the embodiment according to the present invention, boat marks were not observed on the surfaces of 90% of the total number of wafers and, on the other hand, with the boat having the holding grooves 101 shown in FIG. 4, boat marks were observed on the surfaces of more than 50% of the total number of wafers. Protrusions were also observed on the surfaces of the wafers, on which the CVD films were formed, together with the boat marks, but almost no protrusion was observed on the surfaces of the wafers of the embodiment above. The results above shows that the present invention has an effect of great improvement on occurrence of the poor external appearances.

As described above, according to the present invention, a sufficient amount of reaction gas is supplied on the portions of each of wafers held in the respective holding grooves of a boat, regardless of the upper or lower surfaces of the wafer and, as a result, a uniform heat treatment is realized and the uniformity on the lower side of the wafers is greatly improved. Further, according to the present invention, the state of contact between an edge of a wafer and the holding groove can be closest to point contact from conventional linear contact. The point contact thus achieved makes it possible to effectively prevent not only occurrence of boat marks and chipping, but also generation of protrusions or generation of particles on treated wafers. Still further, according to the present invention, a vertical wafer supporting boat is provided, which is preferably used in a CVD apparatus and other heat treatment apparatuses, where heat treatment is operated preferably during rotation of the boat.

We claim:

1. A wafer supporting boat with which a heat treatment is applied to surfaces to be treated of wafers which are disposed in a stacking manner by holding grooves in members disposed in an arc and parallel to an axis of said boat wherein each holding groove is inclined relative to a tangent to said arc of the boat and an upper or lower clearance in the holding groove facing one of the surfaces to be treated of each of the wafers increases in width in the direction of said tangent to said arc of the boat.

2. A wafer supporting boat as recited in claim 1, wherein internal surfaces of each of the grooves respectively facing the surfaces to be treated of each of the wafers are inclined outwardly toward the center of the wafer.

3. A wafer supporting boat as recited in claim 1, wherein said members are such that a first surface of a wafer does not contact an end edge of a first internal surface of a holding groove when an edge of said wafer is positioned at an end corner of a second internal surface of the holding groove.

4. A vertical wafer supporting boat as recited in claim 3, wherein an angle of inclination relative to said tangent to said arc of the boat is set in a range of 4° to 15°.

5. A wafer supporting boat as recited in claim 3 with which a heat treatment is applied to the surfaces inclusive of the lower surface of each of the wafers which are disposed in a stacking manner by the holding grooves, wherein each of the holding grooves is downwardly inclined relative to a direction of said tangent to said arc of the boat and the lower clearance formed between the lower internal surface of the groove and the wafer is so profiled as to gradually increase in width in the direction of said tangent to said arc of the boat to form a edge-like space and the lower internal surface of the groove is downwardly inclined toward a center of the wafer.

6. A wafer supporting boat claimed in claim 5, wherein said heat treatment is a CVD treatment carried out on the surfaces to be treated of each of the wafers, wherein a width of opening of each of the grooves is set in the range of 3±1 mm, the angle of inclination relative to the rotational direction of the boat is set in the range of 6°±3° and the angle of inclination toward the center of the wafer is set in the range of 16°±2°.

7. A wafer supporting boat with which a heat treatment is applied to surfaces to be treated of wafers which are disposed in a stacking manner by holding grooves inside of a furnace tube with an axial line extending in a vertical direction, wherein each of the grooves is inclined relative to a tangential direction of the periphery of the boat and a wafer held by said boat, and a clearance which faces a surface to be treated of each of the wafers gradually increases in width in said tangential direction such that the clearance becomes an edge-like space.

8. A wafer supporting boat as recited in claim 1, wherein said axis of said wafer supporting boat is vertical.

9. A wafer supporting boat as recited in claim 8, wherein said boat is rotated about said axis during said heat treatment and wherein said width of said clearance increases in a direction of rotation about said axis.

10. A wafer supporting boat as recited in claim 2, wherein said axis of said wafer supporting boat is vertical.

11. A wafer supporting boat as recited in claim 10, wherein said wafer supporting boat is rotated about said axis during said heat treatment and wherein said width of said clearance increases in a direction of rotation about said axis.

12. A wafer supporting boat as recited in claim 3, wherein said angle of inclination relative to said tangent to said arc of said boat is in a range of 5° to 12°.

13. A wafer supporting boat as recited in claim 3, wherein said angle of inclination relative to said tangent to said arc of said boat is in a range of 6° to 10°.

14. A wafer supporting boat as recited in claim 5, wherein an angle of inclination of a surface of said holding groove relative to said tangent to said arc of said boat is set in a range of 5° to 12°.

15. A wafer supporting boat as recited in claim 5, wherein an angle of inclination of a surface of said holding groove relative to said tangent to said arc of said boat is set in a range of 6° to 10°.

16. A wafer supporting boat as recited in claim 4, wherein an angle of inclination of a surface of said holding groove toward a center of the wafer is set in a range of 8° to 20°.

17. A wafer supporting boat as recited in claim 4, wherein an angle of inclination of a surface of said holding groove toward a center of the wafer is set in a range of 12° to 18°.

18. A wafer supporting boat as recited in claim 12, wherein an angle of inclination of a surface of said holding groove toward the center of the wafer is set in a range of 8° to 20°.

19. A wafer supporting boat as recited in claim 12, wherein an angle of inclination of a surface of said holding groove toward the center of the wafer is set in a range of 12° to 18°.

20. A wafer supporting boat as recited in claim 13, wherein an angle of inclination of a surface of said holding groove toward the center of the wafer is set in a range of 8° to 20°.

21. A wafer supporting boat as recited in claim 13, wherein an angle of inclination of a surface of said holding groove toward the center of the wafer is set in a range of 12° to 18°.

22. A wafer supporting boat as recited in claim 4 with which a heat treatment is applied to the surfaces inclusive of the lower surface of each of the wafers which are disposed in a stacking manner by the holding grooves, while the boat is rotating in the inside of the furnace tube with the axial line extending in a vertical direction, wherein each of the holding grooves is downwardly inclined relative to a direction of said tangent of said arc of the boat and the lower clearance formed between the lower internal surface of the groove and the wafer is so profiled as to gradually increase in width in the direction of said tangent of said arc of the boat to form a edge-like space and the lower internal surface of the groove is downwardly inclined toward a center of the wafer.

23. A wafer supporting boat as recited in claim 3, wherein an angle of inclination of a surface of said holding groove toward a center of the wafer is set in a range of 8° to 20°.

24. A wafer supporting boat as recited in claim 3, wherein an angle of inclination of a surface of said holding groove toward a center of the wafer is set in a range of 12° to 18°.

25. A wafer supporting boat as recited in claim 5, wherein an angle of inclination of a surface of said holding groove toward the center of the wafer is set in a range of 8° to 20°.

26. A wafer supporting boat as recited in claim 5, wherein an angle of inclination of a surface of said holding groove toward the center of the wafer is set in a range of 12° to 18°.

27. A wafer supporting boat with which a heat treatment is applied to surfaces to be treated of wafers which are disposed in a stacking manner by holding grooves in members disposed in an arc and parallel to an axis of said boat, while the boat is rotating inside a furnace tube with an axial line of said boat extending in a vertical direction, wherein each holding groove is inclined relative to the rotational direction of the boat and an upper or lower clearance in the holding groove facing one of the surfaces to be treated of each of the wafers increases in width in the rotational direction of the boat.

* * * * *